United States Patent
Chen et al.

(10) Patent No.: US 9,417,797 B2
(45) Date of Patent: Aug. 16, 2016

(54) ESTIMATING READ REFERENCE VOLTAGE BASED ON DISPARITY AND DERIVATIVE METRICS

(71) Applicant: Seagate Technology LLC, Cupertino, CA (US)

(72) Inventors: Zhengang Chen, San Jose, CA (US); Erich F. Haratsch, San Jose, CA (US); Sundararajan Sankaranarayanan, Fremont, CA (US); Yunxiang Wu, Cupertino, CA (US)

(73) Assignee: Seagate Technology LLC, Cupertino, CA (US)

( * ) Notice: Subject to any disclaimer, the term of this patent is extended or adjusted under 35 U.S.C. 154(b) by 98 days.

(21) Appl. No.: 14/299,195

(22) Filed: Jun. 9, 2014

(65) Prior Publication Data

US 2015/0355838 A1    Dec. 10, 2015

(51) Int. Cl.
*G11C 16/28* (2006.01)
*G06F 3/06* (2006.01)
*G11C 16/26* (2006.01)

(52) U.S. Cl.
CPC ............ *G06F 3/061* (2013.01); *G06F 3/0653* (2013.01); *G06F 3/0679* (2013.01); *G11C 16/26* (2013.01); *G11C 16/28* (2013.01)

(58) Field of Classification Search
CPC ................................. G11C 16/28; G11C 16/26
See application file for complete search history.

(56) References Cited

U.S. PATENT DOCUMENTS

| | | | | |
|---|---|---|---|---|
| 6,052,020 | A * | 4/2000 | Doyle | G05F 3/30 323/313 |
| 8,683,297 | B2 | 3/2014 | Jeon et al. | |
| 2006/0227598 | A1* | 10/2006 | Sakimura | G11C 11/1673 365/158 |
| 2014/0068365 | A1 | 3/2014 | Chen et al. | |
| 2014/0198569 | A1* | 7/2014 | Kim | G11C 16/28 365/185.03 |

* cited by examiner

*Primary Examiner* — Douglas King
(74) *Attorney, Agent, or Firm* — Robert A. Blaha; Smith Tempel Blaha LLC (57) ABSTRACT

An adaptive channel tracking algorithm performed by a flash memory system obtains disparity metrics and derivative metrics and uses a combination of the disparity and derivative metrics to estimate an optimal read reference voltage. The estimation of the optimal read reference voltage does not rely on assumptions about the underlying cell voltage distributions and results in a good estimate of the read reference voltage even if the standard deviations of the cell voltage distributions are different. In addition, the algorithm is relatively simple and less computationally intensive to perform than the known tracking algorithms.

34 Claims, 5 Drawing Sheets

ESTIMATING READ REFERENCE VOLTAGE BASED ON DISPARITY AND DERIVATIVE METRICS

FIELD OF INVENTION

The invention relates generally to flash memory controllers and, more specifically, to tracking disparity and derivative metrics and using the disparity and derivative metrics to estimate a read reference voltage.

BACKGROUND

A flash memory is a non-volatile electrically erasable data storage device that evolved from electrically erasable programmable read-only memory (EEPROM). The two main types of flash memory are named after the logic gates that their storage cells resemble: NAND and NOR. NAND flash memory is commonly used in solid-state drives, which are supplanting magnetic disk drives in many applications. A NAND flash memory is commonly organized as multiple blocks, with each block organized as multiple pages. Each page comprises multiple cells. Each cell is capable of storing an electric charge. Some cells are used for storing data bits, while other cells are used for storing error-correcting code bits. A cell configured to store a single bit is known as a single-level cell (SLC). A cell configured to store two bits is known as a multi-level cell (MLC). In an MLC cell, one bit is commonly referred to as the least-significant bit (LSB), and the other as the most-significant bit (MSB). A cell configured to store three bits is known as a triple-level cell (TLC). Writing data to a flash memory is commonly referred to as "programming" the flash memory, due to the similarity to programming an EEPROM.

The electric charge stored in a cell can be detected in the form of a cell voltage. To read an SLC flash memory cell, the flash memory controller provides one or more reference voltages (also referred to as read voltages) to the flash memory device. Detection circuitry in the flash memory device will interpret the bit as a "0" if the cell voltage is greater than a read reference voltage, Vref, and will interpret the bit as a "1" if the cell voltage is less than the read reference voltage Vref. Thus, an SLC flash memory requires a single read reference voltage Vref. In contrast, an MLC flash memory requires three such reference voltages, and a TLC flash memory requires seven such reference voltages. Thus, reading data from an MLC or TLC flash memory device requires that the controller provide multiple read reference voltages having optimal values that allow the memory device to correctly detect the stored data values.

Determining or detecting stored data values using controller-provided read reference voltages is hampered by undesirable physical non-uniformity across cells of a device that are inevitably introduced by the fabrication process, as such non-uniformity results in the read reference voltages of different cells that store the same bit value being significantly different from each other. The detection is further hampered by target or optimal read reference voltages changing over time due to degradation of the flash read channel over time adverse, which may be caused by, for example, changes in temperature, interference from programming neighboring cells, numerous erase-program cycles, read disturbance effects, and data retention effects. Errors in detecting stored data values are reflected in the performance measurement known as bit error rate (BER). The use of error-correcting codes (ECCs) can improve BER to some extent, but the effectiveness of ECCs diminishes as improved fabrication processes result in smaller cell features.

An effective scheme for detecting stored data values should adapt to changes in the flash read channel in order to achieve optimal or near-optimal performance. It is known to utilize adaptive channel tracking algorithms in flash memory systems to adaptively adjust read reference voltages, re-computer reliability messages, and make other changes that improve performance based on changes in the flash read channel. For example, known adaptive channel tracking algorithms track variations in the flash read channel and maintain a set of updated channel parameters. The updated channel parameters are used, for example, to adjust hard/soft read reference voltages and to re-compute reliability messages. Typically, known adaptive channel tracking algorithms assume that the underlying write voltage distributions are Gaussian or Gaussian-like and that the success of estimating the optimal read reference voltage is dependent on the success of estimating Gaussian parameters. Such algorithms are relatively complex and computationally intensive to perform. In addition, such algorithms can result in performance penalties due to the explicit reliance on assumptions about the underlying Gaussian or Gaussian-like distributions that may not be accurate.

One known adaptive channel tracking algorithm tracks a disparity metric and adjusts the read reference voltage based on the disparity metric. Disparity can be defined as the ratio of the number of 1 bits in a bit sequence to the total number of bits in the bit sequence. The tracking algorithm causes one or more pages of flash memory to be read multiple times using different read reference voltages, which are known as soft reads, and calculates the disparity metric. The read reference voltage that results in a disparity metric of 0.5 (i.e., equal number of 1 bits and 0 bits in the sequence) is the chosen as the optimal read reference voltage. While this method is effective when the two Gaussian cell voltage distributions have nearly the same standard deviation, it can result in a poor estimate for the read reference voltage when the standard deviations differ significantly.

Accordingly, a need exists for an adaptive channel tracking algorithm that tracks changes in the flash read channel and makes appropriate adjustments to the read reference voltage based on the changes.

SUMMARY OF THE INVENTION

A data storage system, a solid-state disk (SSD) controller used in the storage system, a method performed by the SSD controller, and a computer-readable medium (CRM) having computer instructions thereon for execution by the SSD controller. The storage system comprises the SSD controller and a nonvolatile memory (NVM) comprising at least a first flash memory die having a plurality of flash memory cells. The SSD controller is in communication with the NVM memory via a first interface (I/F) of the storage system. The SSD controller is configured to perform a soft read process during which the SSD controller repeatedly reads one or more pages of the memory cells N times using N respective read reference voltages, $V_1$ to $V_N$, where N is a positive integer that is equal to or greater than 2. During the soft read process, the SSD controller processes the read date to calculate N disparity values, $\Delta V_1$ to $\Delta V_N$, for the N reads, respectively, and generates a disparity vector comprising the N disparity values. Each disparity value is calculated by taking a ratio of a number of 1 bits in a bit sequence corresponding to the respective pages or pages read to a total number of bits in the bit sequence. During the soft read process, after generating the disparity vector, the SSD controller takes a derivative of the disparity vector to obtain a derivative vector having N−1 derivative values, $\delta(V_1)$ to $\delta(V_{N-1})$, and then uses the disparity vector and the derivative vector to estimate an optimal read reference voltage, $V_{REF,DD}$, to be used by the SSD controller in a subsequent hard read process to read said one or more pages.

The SSD controller comprises a memory buffer and a processor. The processor is configured to execute read commands in order to read the memory cells. The processor is configured perform a soft read process during which the processor repeatedly reads one or more pages of the memory cells N times using N respective read reference voltages, $V_1$ to $V_N$, and stores the read page or pages in the memory buffer, where N is a positive integer that is equal to or greater than 2. During the soft read process, the processor processes the read page or pages stored in the memory buffer to calculate N disparity values, $\Delta V_1$ to $\Delta V_N$, for the N reads, respectively, and generates a disparity vector comprising the N disparity values. During the soft read process, after generating the disparity vector, the processor takes the derivative of the disparity vector to obtain a derivative vector having N−1 derivative values, $\delta(V_1)$ to $\delta(V_{N-1})$, and then uses the disparity vector and the derivative vector to estimate an optimal read reference voltage, $V_{REF,DD}$, to be used by the SSD controller in a subsequent hard read process to read said one or more pages.

The method comprises the following: with the SSD controller, performing the soft read process during which the SSD controller repeatedly reads one or more pages of the memory cells N times using N respective read reference voltages; in the SSD controller, during the soft read process, calculating N disparity values, $\Delta V_1$ to $\Delta V_N$, for the N reads, respectively, and generating a disparity vector comprising the N disparity values, wherein each disparity value is calculated by taking a ratio of a number of 1 bits in a bit sequence corresponding to the respective pages or pages read to a total number of bits in the bit sequence; in the SSD controller, during the soft read process, after generating the disparity vector, taking a derivative of the disparity vector to obtain a derivative vector having N−1 derivative values, $\delta(V_1)$ to $\delta(V_{N-1})$; and in the SSD controller, using the disparity vector and the derivative vector to estimate an optimal read reference voltage, $V_{REF,DD}$, to be used by the SSD controller in a subsequent hard read process to read said one or more pages.

The CRM comprises computer instructions for execution by a processor of a SSD controller for estimating an optimum read reference voltage to be used by the SSD controller for reading data from a NVM. The CRM comprises: a first set of instructions for performing a soft read process during which the SSD controller repeatedly reads one or more pages of the memory cells N times using N respective read reference voltages; a second set of instructions for calculating N disparity values for the N reads, respectively, and for generating a disparity vector comprising the N disparity values; a third set of instructions for taking a derivative of the disparity vector to obtain a derivative vector having N−1 derivative values; and a fourth set of instructions for using the disparity vector and the derivative vector to estimate an optimal read reference voltage, $V_{REF,DD}$, to be used by the SSD controller in a subsequent hard read process to read said one or more pages.

These and other features and advantages of the invention will become apparent from the following description, drawings and claims.

DETAILED DESCRIPTION OF AN ILLUSTRATIVE EMBODIMENT

In accordance with the invention, an adaptive channel tracking algorithm performed by a flash memory system obtains disparity metrics and derivative metrics and uses a combination of the disparity and derivative metrics to estimate an optimal read reference voltage. The estimation of the optimal read reference voltage does not rely on assumptions about the underlying cell voltage distributions and results in a good estimate of the read reference voltage even if the standard deviations of the cell voltage distributions are different. In addition, the algorithm is relatively simple and less computationally intensive to perform than the known tracking algorithms.

Embodiments of the invention may be implemented in a number of ways, and therefore a few illustrative embodiments are described herein with reference to the figures. Before describing a specific illustrative, or exemplary, embodiment of the adaptive channel tracking algorithm, an illustrative embodiment of a storage system in which the algorithm may be employed will be described with reference to FIGS. 1 and 2. Illustrative embodiments of the methods will then be described with reference to FIGS. 3-. Like reference numerals in the figures identify like features, components or elements throughout the figures and detailed description. Features, components or elements in the figures are not drawn to scale.

Figure 1:
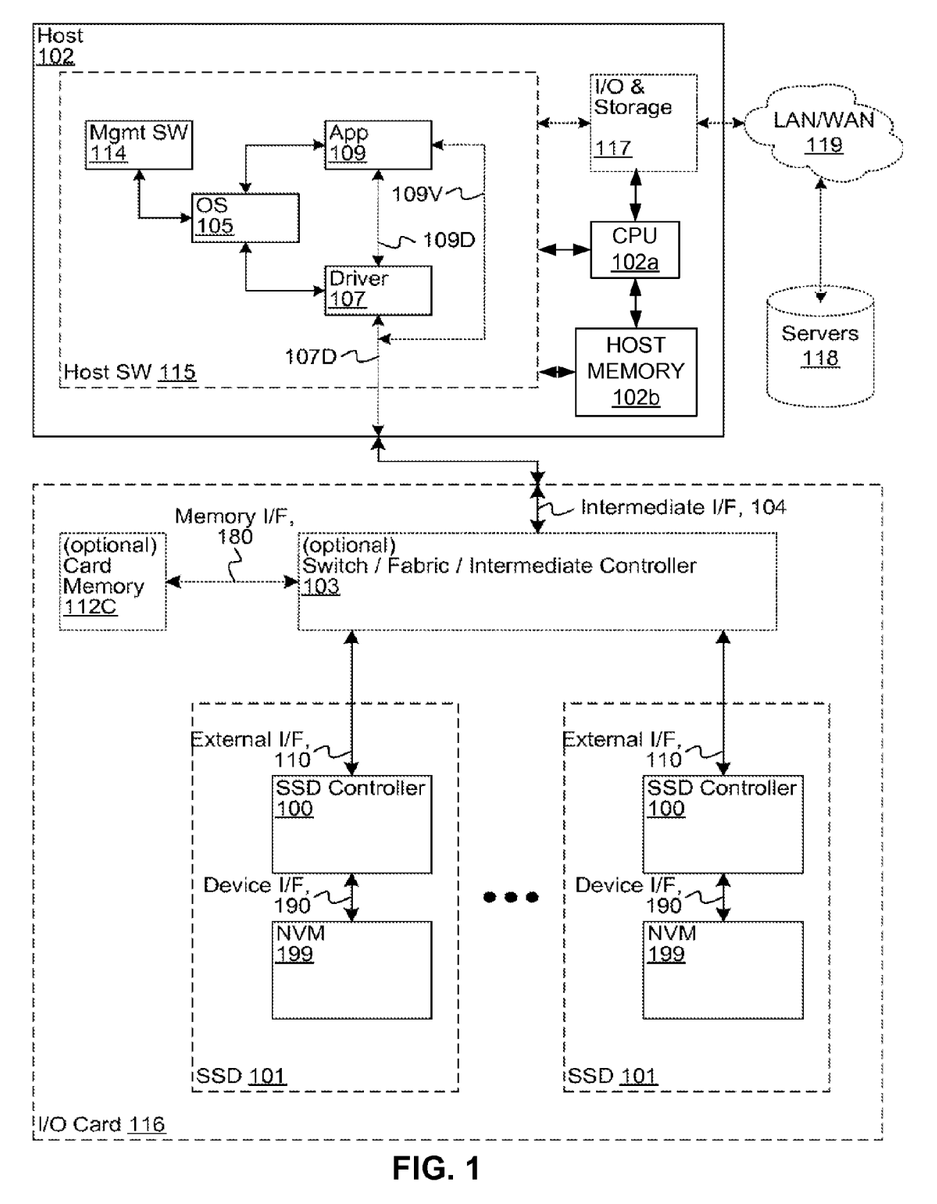
FIG. 1 illustrates a block diagram of a storage system in accordance with an illustrative embodiment that includes one or more instances of an SSD device that is suitable for implementing the invention.

FIG. 1 illustrates a block diagram of a storage system in accordance with an illustrative embodiment that includes one or more instances of a solid state drive (SSD) 101 that implements the adaptive channel tracking algorithm of the invention. The SSD 101 includes an SSD controller 100 coupled to NVM 199 via device interfaces 190. The SSD controller 100 is a flash memory controller. As will be described below in more detail with reference to FIG. 2, the NVM 199 comprises one or more flash memory dies, each of which comprises a plurality of flash cells. The storage system may include, for example, a host system 102, a single SSD 101 coupled directly to the host system 102, a plurality of SSDs 101 each respectively coupled directly to the host system 102 via respective external interfaces, or one or more SSDs 101 coupled indirectly to a host system 102 via various interconnection elements.

For example, a single SSD 101 may be coupled directly to the host system 102 via external interface 110 (e.g., switch/fabric/intermediate controller 103 is omitted, bypassed, or passed-through). As another example, a plurality of SSDs 101 may be coupled directly to the host system 102 via respective external interfaces via a respective instance of external interfaces 110 (e.g., switch/fabric/intermediate controller 103 is omitted, bypassed, or passed-through). As another example, one or more SSDs 101 may be coupled indirectly to host system 102 via external interfaces 110 coupled to switch/fabric/intermediate controller 103, and via intermediate interfaces 104 coupled to host system 102.

The host system 102 includes one or more processors, such as, for example, one or more microprocessors and/or microcontrollers operating as a central processing unit (CPU) 102a, and a host memory device 102b for storing instructions and data used by the host CPU 102a. Host system 102 is enabled or configured via the host CPU 102a to execute various elements of host software 115, such as various combinations of operating system (OS) 105, driver 107, application 109, and multi-device management software 114. The host software 115 is stored in a memory device 102b of the host system 102 and is executed by the host CPU 102a. Dotted-arrow 107D is representative of host software←→I/O device communication, e.g., data sent/received to/from one or more of the instances of SSD 101 and from/to any one or more of OS 105 via driver 107, driver 107, and application 109, either via driver 107, or directly as a VF.

OS 105 includes and/or is enabled or configured to operate with drivers (illustrated conceptually by driver 107) for interfacing with the SSD. Various versions of Windows (e.g., 95, 98, ME, NT, XP, 2000, Server, Vista, and 7), various versions of Linux (e.g., Red Hat, Debian, and Ubuntu), and various versions of MacOS (e.g., 8, 9 and X) are examples of OS 105. In various embodiments, the drivers are standard and/or generic drivers (sometimes termed "shrink-wrapped" or "pre-installed") operable with a standard interface and/or protocol such as SATA, AHCI, or NVM Express, or are optionally customized and/or vendor specific to enable use of commands specific to SSD 101.

Some drives and/or drivers have pass-through modes to enable application-level programs, such as application 109 via optimized NAND Access (sometimes termed ONA) or direct NAND Access (sometimes termed DNA) techniques, to communicate commands directly to SSD 101, enabling a customized application to use commands specific to SSD 101 even with a generic driver. ONA techniques include one or more of: use of non-standard modifiers (hints); use of vendor-specific commands; communication of non-standard statistics, such as actual NVM usage according to compressibility; and other techniques. DNA techniques include one or more of: use of non-standard commands or vendor-specific providing unmapped read, write, and/or erase access to the NVM; use of non-standard or vendor-specific commands providing more direct access to the NVM, such as by bypassing formatting of data that the I/O device would otherwise do; and other techniques. Examples of the driver are a driver without ONA or DNA support, an ONA-enabled driver, a DNA-enabled driver, and an ONA/DNA-enabled driver. Further examples of the driver are a vendor-provided, vendor-developed, and/or vendor-enhanced driver, and a client-provided, client-developed, and/or client-enhanced driver.

Examples of application-level programs are an application without ONA or DNA support, an ONA-enabled application, a DNA-enabled application, and an ONA/DNA-enabled application. Dotted-arrow 109D is representative of application←←→I/O device communication (e.g. bypass via a driver or bypass via a VF for an application), e.g. an ONA-enabled application and an ONA-enabled driver communicating with an SSD, such as without the application using the OS as an intermediary. Dotted-arrow 109V is representative of application←→I/O device communication (e.g. bypass via a VF for an application), e.g. a DNA-enabled application and a DNA-enabled driver communicating with an SSD, such as without the application using the OS or the driver as intermediaries.

Some of the embodiments that include switch/fabric/intermediate controller 103 also include card memory 112C coupled via memory interface 180 and accessible by the SSDs 101. In various embodiments, one or more of the SSDs 101, the switch/fabric/intermediate controller 103, and/or the card memory 112C are included on a physically identifiable module, card, or pluggable element (e.g., I/O Card 116). In some embodiments, SSD 101 (or variations thereof) corresponds to a SAS drive or a SATA drive that is coupled to an initiator operating as host system 102.

In some embodiments that do not include the switch/fabric/intermediate controller, the SSD 101 is coupled to the host system 102 directly via external interfaces 110. In various embodiments, SSD Controller 100 is coupled to the host system 102 via one or more intermediate levels of other controllers, such as a RAID controller. In some embodiments, SSD 101 (or variations thereof) corresponds to a SAS drive or a SATA drive and switch/fabric/intermediate controller 103 corresponds to an expander that is in turn coupled to an initiator, or alternatively switch/fabric/intermediate controller 103 corresponds to a bridge that is indirectly coupled to an initiator via an expander. In some embodiments, switch/fabric/intermediate controller 103 includes one or more PCIe switches and/or fabrics.

In various embodiments, such as some of the embodiments where host system 102 is a computing host (e.g., a computer, a workstation computer, a server computer, a storage server, a SAN, a NAS device, a DAS device, a storage appliance, a PC, a laptop computer, a notebook computer, and/or a netbook computer), the computing host may be optionally enabled to communicate (e.g., via optional I/O & Storage Devices/Resources 117 and optional LAN/WAN 119) with one or more local and/or remote servers (e.g., optional servers 118). The communication enables, for example, local and/or remote access, management, and/or usage of any one or more of SSD 101 elements. In some embodiments, the communication is wholly or partially via Ethernet. In some embodiments, the communication is wholly or partially via Fibre Channel. LAN/WAN 119 is representative, in various embodiments, of one or more Local and/or Wide Area Networks, such as any one or more of a network in a server farm, a network coupling server farms, a metro-area network, and the Internet.

In various embodiments, an SSD controller and/or a computing-host flash memory controller in combination with one or more NVMs are implemented as a non-volatile storage component, such as a USB storage component, a CF storage component, an MMC storage component, an eMMC storage component, a Thunderbolt storage component, a UFS storage component, an SD storage component, a memory stick storage component, and an xD-picture card storage component.

In various embodiments, all or any portions of an SSD controller (or a computing-host flash memory controller), or functions thereof, are implemented in a host that the controller is to be coupled with (e.g., host system 102). In various embodiments, all or any portions of an SSD controller (or a computing-host flash memory controller), or functions thereof, are implemented via hardware (e.g., logic circuitry), software and/or firmware (e.g., driver software or SSD control firmware), or any combination thereof.

Figure 2:
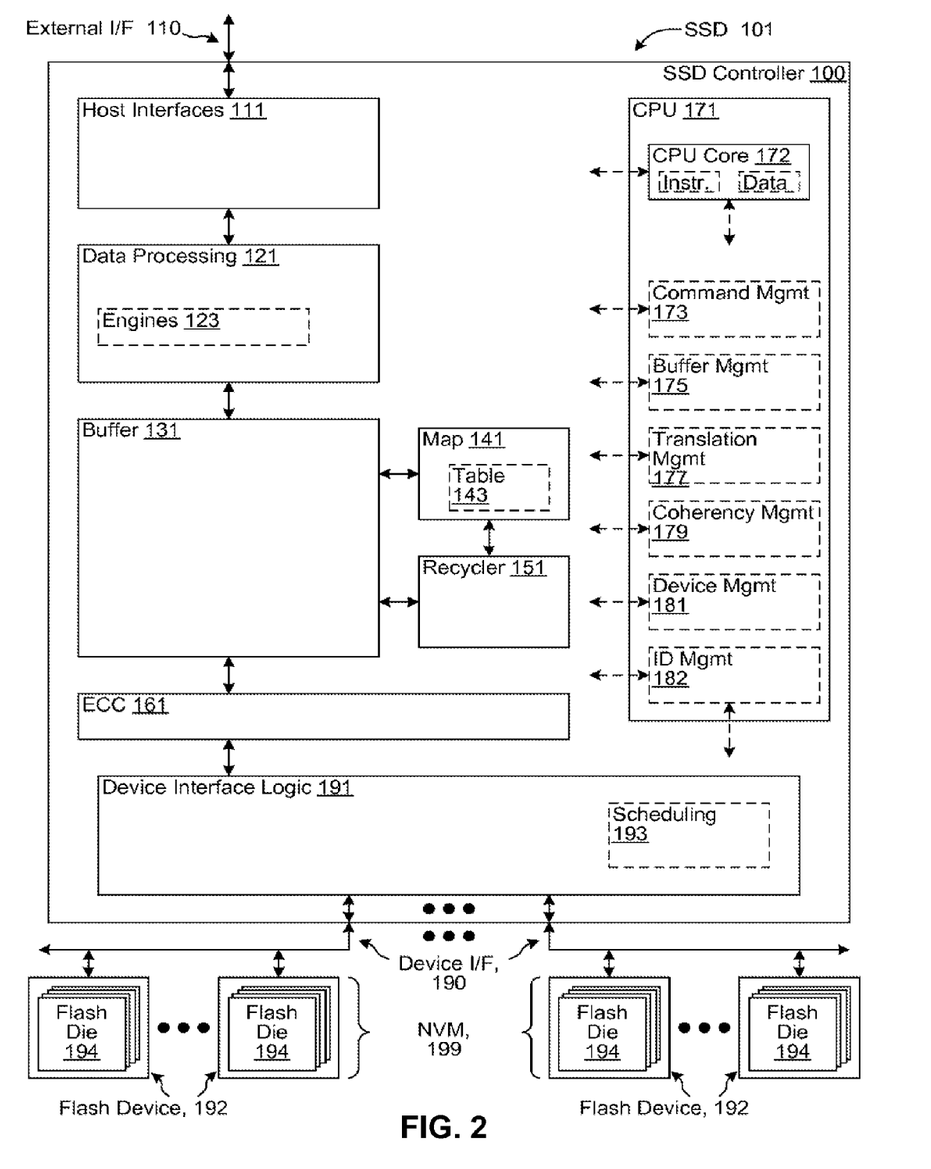
FIG. 2 illustrates a block diagram of an illustrative embodiment of one of the SSDs shown in FIG. 1 including the SSD controller shown in FIG. 1.

FIG. 2 illustrates a block diagram of an illustrative embodiment of one of the SSDs 101 shown in FIG. 1 including the SSD controller 100 shown in FIG. 1 and flash memory dies 194 of NVM 199. Prior to describing illustrative embodiments of methods that the SSD controller 100 performs to obtain and use the derivative and disparity metrics to estimate the optimal read reference voltage, a configuration of the SSD controller 100 that is suitable for performing the methods will be described with reference to FIG. 2.

SSD controller 100 is communicatively coupled via one or more external interfaces 110 to the host system 102 (FIG. 1). According to various embodiments, external interfaces 110 are one or more of: a SATA interface; a SAS interface; a PCIe interface; a Fibre Channel interface; an ethernet interface (such as 10 Gigabit Ethernet); a non-standard version of any of the preceding interfaces; a custom interface; or any other type of interface used to interconnect storage and/or communications and/or computing devices. For example, in some embodiments, SSD controller 100 includes a SATA interface and a PCIe interface.

SSD controller 100 is further communicatively coupled via one or more device interfaces 190 to NVM 199, which includes one or more flash devices 192. According to various illustrative embodiments, device interfaces 190 are one or more of: an asynchronous interface; a synchronous interface; a single-data-rate (SDR) interface; a double-data-rate (DDR) interface; a DRAM-compatible DDR or DDR2 synchronous interface; an ONFI compatible interface, such as an ONFI 2.2 or ONFI 3.0 compatible interface; a Toggle-mode compatible flash interface; a non-standard version of any of the preceding interfaces; a custom interface; or any other type of interface used to connect to storage devices.

Each flash memory device 192 includes one or more individual flash dies 194. According to type of a particular one of flash devices 192, a plurality of the flash dies 194 in the particular flash memory device 192 is optionally and/or selectively accessible in parallel. Flash memory device 192 is merely representative of one type of storage device enabled to communicatively couple to SSD controller 100. In various embodiments, any type of storage device is usable, such as an SLC NAND flash memory, MLC NAND flash memory, NOR flash memory, flash memory using polysilicon or silicon nitride technology-based charge storage cells, two- or three-dimensional technology-based flash memory, read-only memory, static random access memory, dynamic random access memory, ferromagnetic memory, phase-change memory, racetrack memory, ReRAM, or any other type of memory device or storage medium.

According to various embodiments, device interfaces 190 are organized as: one or more busses with one or more of flash memory device 192 per bus; one or more groups of busses with one or more of flash memory device 192 per bus, where busses in a group are generally accessed in parallel; or any other organization of one or more of flash memory device 192 onto device interfaces 190.

The SSD controller 100 typically, but not necessarily, has one or more modules, such as, for example, host interfaces module 111, data processing module 121, buffer module 131, map module 141, recycler module 151, ECC module 161, Device interface logic module 191, and CPU 171. The specific modules and interconnections illustrated in FIG. 2 are merely representative of one embodiment, and many arrangements and interconnections of some or all of the modules, as well as additional modules not illustrated, are possible, and fewer than all of the modules shown in FIG. 2 may be included in the SSD controller 100. In a first example, in some embodiments, there are two or more host interfaces 111 to provide dual-porting. In a second example, in some embodiments, data processing module 121 and/or ECC module 161 are combined with buffer module 131. In a third example, in some embodiments, Host interfaces module 111 is directly coupled to buffer module 131, and data processing module 121 optionally and/or selectively operates on data stored in buffer module 131. In a fourth example, in some embodiments, device interface logic module 191 is directly coupled to buffer module 131, and ECC module 161 optionally and/or selectively operates on data stored in buffer module 131.

Host interfaces module 111 sends and receives commands and/or data via external interfaces 110. For example, the commands include a read command specifying an address (such as a logical block address (LBA)) and an amount of data (such as a number of LBA quanta, e.g., sectors) to read; in response the SSD 101 provides read status and/or read data. As another example, the commands include a write command specifying an address (such as an LBA) and an amount of data (such as a number of LBA quanta, e.g., sectors) to write; in response the SSD 101 provides write status and/or requests write data and optionally subsequently provides write status. For yet another example, the commands include a de-allocation command (e.g., a trim command) specifying one or more addresses (such as one or more LBAs) that no longer need be allocated.

According to various embodiments, one or more of: data processing module 121 optionally and/or selectively processes some or all data sent between buffer module 131 and external interfaces 110; and data processing module 121 optionally and/or selectively processes data stored in buffer module 131. In some embodiments, data processing module 121 uses one or more engines 123 to perform one or more of: formatting; reformatting; transcoding; and any other data processing and/or manipulation task.

Buffer module 131 stores data sent to/from external interfaces 110 from/to device interfaces 190. In some embodiments, buffer module 131 additionally stores system data, such as some or all map tables, used by SSD controller 100 to manage one or more of the flash devices 192. In accordance with an illustrative embodiment, buffer module 131 stores bit sequences that are read from the flash dies 194 and processed by the CPU 171 to compute the disparity and derivative metrics and to estimate the read reference voltage based on those metrics. The buffer module 131 is typically a portion of the local memory of the SSD controller 100 that has been allocated for use as temporary storage for storing page data read from the flash die 194. The buffer module 131 typically, but not necessarily, also includes a direct memory access (DMA) engine (not shown) that is used to control movement of data to and/or from the Buffer module 131 and ECC-X engine (not shown) that is used to provide higher-level error correction and/or redundancy functions.

According to various embodiments, ECC module 161 optionally and/or selectively processes some or all data sent between buffer module 131 and device interfaces 190. ECC module 161 optionally and/or selectively processes data stored in buffer module 131. In some embodiments, ECC module 161 is used to provide lower-level error correction and/or redundancy functions in accordance with one or more ECC techniques. In some embodiments, ECC module 161 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding. In some embodiments, ECC module 161 includes one or more decoders (such as LDPC decoders).

Device interface logic module 191 controls instances of flash memory device 192 via device interfaces 190. Device interface logic module 191 is enabled to send data to/from the instances of flash memory device 192 according to a protocol of flash memory device 192. Device interface logic module 191 typically includes scheduling logic 193 that selectively sequence controls instances of flash memory device 192 via device interfaces 190. For example, in some embodiments, scheduling logic 193 is enabled to queue operations to the instances of flash memory device 192, and to selectively send the operations to individual ones of the instances of flash memory device 192 (or flash die 194) as individual ones of the instances of flash memory device 192 (or flash die 194) become available.

Map module 141 converts between data addressing used on external interfaces 110 and data addressing used on device interfaces 190, using table 143 to map external data addresses to locations in NVM 199. For example, in some embodiments, map module 141 converts LBAs used on external interfaces 110 to block and/or page addresses targeting one or more flash die 194, via mapping provided by table 143. In some embodiments, map module 141 uses table 143 to perform and/or to look up translations between addresses used on external interfaces 110 and data addressing used on device interfaces 190. According to various embodiments, table 143 is one or more of: a one-level map; a two-level map; a multi-level map; a map cache; a compressed map; any type of mapping from one address space to another; and any combination of the foregoing. According to various embodiments, table 143 includes one or more of: static random access memory; dynamic random access memory; NVM (such as flash memory); cache memory; on-chip memory; off-chip memory; and any combination of the foregoing.

In some embodiments, recycler module 151 performs garbage collection. For example, in some embodiments, instances of flash memory device 192 contain blocks that must be erased before the blocks are re-writeable. Recycler module 151 is enabled to determine which portions of the instances of flash memory device 192 are actively in use (e.g., allocated instead of de-allocated), such as by scanning a map maintained by map module 141, and to make unused (e.g., de-allocated) portions of the instances of flash memory device 192 available for writing by erasing them. In further embodiments, recycler module 151 is enabled to move data stored within instances of flash memory device 192 to make larger contiguous portions of the instances of flash memory device 192 available for writing.

In some embodiments, instances of flash memory device 192 are selectively and/or dynamically configured, managed, and/or used to have one or more bands for storing data of different types and/or properties. A number, arrangement, size, and type of the bands are dynamically changeable. For example, data from a computing host is written into a hot (active) band, while data from recycler module 151 is written into a cold (less active) band. In some usage scenarios, if the computing host writes a long, sequential stream, then a size of the hot band grows, whereas if the computing host does random writes or few writes, then a size of the cold band grows.

CPU 171 controls various portions of SSD controller 100. CPU 171 typically includes CPU Core 172, which is, according to various embodiments, one or more single-core or multi-core processors. The individual processor cores in CPU core 172 are, in some embodiments, multi-threaded. CPU core 172 includes instruction and/or data caches and/or memories. For example, the instruction memory contains instructions to enable CPU core 172 to execute programs (e.g., software sometimes called firmware) to control SSD Controller 100. In some embodiments, some or all of the firmware executed by CPU core 172 is stored on instances of flash memory device 192.

In various embodiments, CPU 171 further includes: command management logic 173 for tracking and controlling commands received via external interfaces 110 while the commands are in progress; buffer management logic 175 for controlling allocation and use of buffer module 131; translation Management logic 177 for controlling map module 141; coherency management module 179 for controlling consistency of data addressing and for avoiding conflicts such as between external data accesses and recycle data accesses; device management logic 181 for controlling device interface logic 191; identity management logic 182 for controlling modification and communication of identity information, and optionally other management units. None, any, or all of the management functions performed by CPU 171 are, according to various embodiments, controlled and/or managed by hardware, by software (such as firmware executing on CPU core 172 or on host system 102 (FIG. 1) connected via external interfaces 110), or any combination thereof.

In various embodiments, all or any portions of an SSD Controller 100 are implemented on a single IC, a single die of a multi-die IC, a plurality of dice of a multi-die IC, or a plurality of ICs. The SSD controller 100 and one or more of the flash devices 192 may be implemented on the same die, although they are typically implemented on separate dies.

Having described examples of an SSD and an SSD controller that are suitable for implementing methods of the invention, illustrative embodiments of the methods of the invention will now be described with reference to FIGS. 3-5. U.S. application Ser. No. 13/533,130 filed on Jun. 26, 2012, which is assigned to the assignee of the present application and which is hereby incorporated by reference herein in its entirety, discloses an adaptive channel tracking algorithm that tracks metrics in a flash memory system, including the disparity metric. The present invention may utilize methods disclosed in U.S. application Ser. No. 13/533,130 for tracking the disparity metric. It should be noted, however, that the present invention may use other methods to track the disparity metric and that the invention is not limited in regard to the method or device that is used to track the disparity metric.

Figure 3:
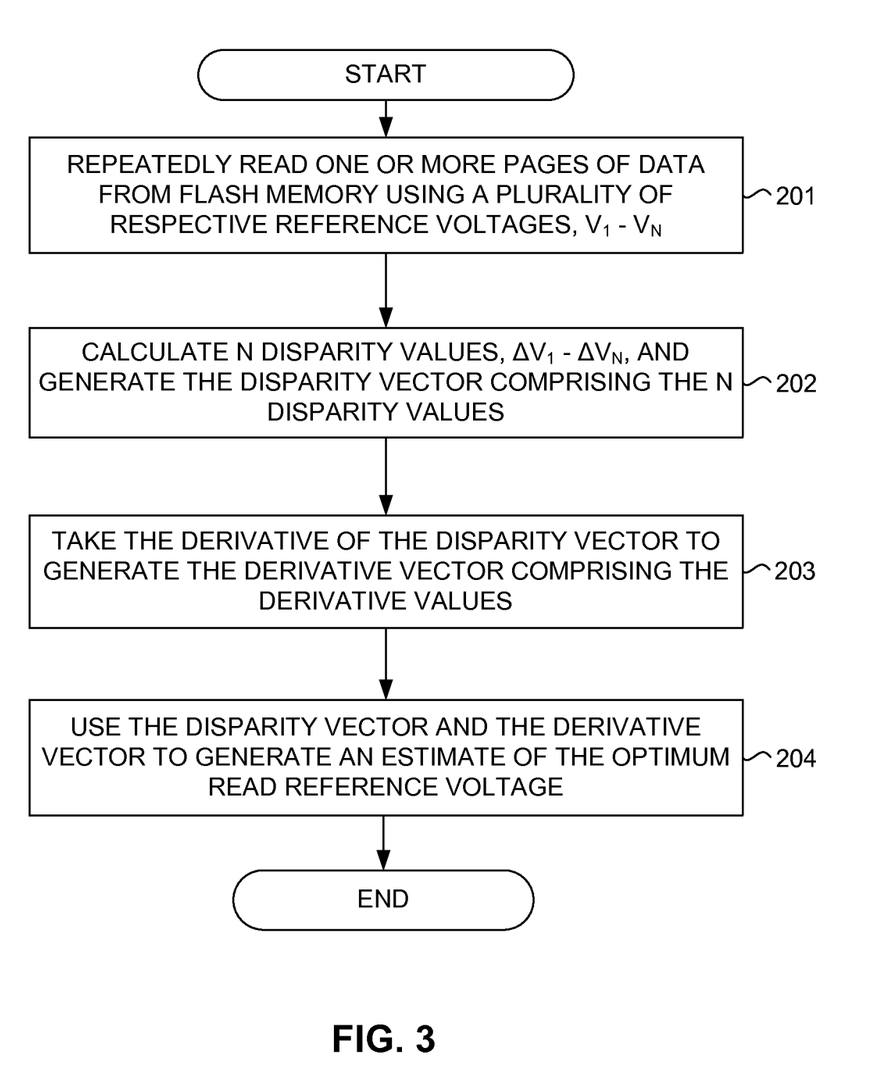
FIG. 3 illustrates a flow diagram that represents the method performed by the SSD controller shown in FIG. 2 in accordance with an illustrative embodiment for obtaining the derivative and disparity metrics and for using those metrics to estimate the optimal read reference voltage.

FIG. 3 illustrates a flow diagram that represents the method performed by the SSD controller 100 in accordance with an illustrative embodiment for obtaining the derivative and disparity metrics and for using those metrics to estimate the optimal read reference voltage. It should be noted that the term "optimal read reference voltage," as that term is used herein is not necessarily intended to denote the best estimate of the read reference voltage, but is intended to denote an estimate of the read reference voltage that should be the best estimate given the information that is being used by the SSD controller 100 to compute the estimate. It may be possible under some circumstances that the read reference voltage estimated by the method of the present invention is not the best read reference voltage to be used, but it should be at least better than the current read reference voltage unless the current read reference voltage happens to be truly the best read reference voltage that can be used under the circumstances.

In the step represented by block 201 of FIG. 3, one or more pages of data are repeatedly read from one or more of the flash dies 194 using respective different read reference voltages ranging from $V_1$ to $V_N$, where N is a positive integer that is equal to or greater than 2 and typically at least greater than 3. In the step represented by block 202, N disparity values, $\Delta V_1$ to $\Delta V_N$, are calculated for the N read operations, respectively, and a disparity vector comprising the N values is generated. Each disparity value is calculated by taking the ratio of the number of 1 bits in the respective bit sequence to the total number of bits in the sequence. The N disparity vector, $\overline{\Delta}(\overline{V})$ is expressed as:

$$\overline{\Delta}(\overline{V}) = [\Delta(V_1), \Delta(V_2), \Delta(V_3), \ldots, \Delta(V_N)] \quad \text{Equation 1}$$

After the disparity vector has been obtained, the mathematical derivative of the disparity vector is taken to obtain a derivative vector, $\overline{\delta}(\overline{V})$:

$$\overline{\delta}(\overline{V}) = [\delta(V_1), \delta(V_2), \delta(V_3), \ldots, \delta(V_{N-1})], \quad \text{Equation 2}$$

where the derivative values, $\delta(V_1)$ through $\delta(V_{N-1})$ are given as: $\delta(V_1) = \Delta V_2 - \Delta V_1$, $\delta(V_2) = \Delta V_3 - \Delta V_2$, $\delta(V_3) = \Delta V_4 - \Delta V_3 \ldots$ $\delta(V_{N-1}) = \Delta V_N - \Delta V_{N-1}$. This step is represented by block 203. After the disparity and derivative vectors have been obtained, they are both used to generate an estimate of the optimal read reference voltage, as indicated by block 204.

The read operations represented by block 201 during which the page or pages are repeatedly read using the different read reference voltages are "soft" reads because the read operations are not being used to determine actual bit values that will be returned to the host system 102 (FIG. 1). After step 204 has been performed to estimate the optimal read reference voltage, the estimated optimal read reference voltage is used by the SSD controller 100 to read the same page or pages from the from flash memory 199. The SSD controller 100 then decodes the corresponding bits and sends the decoded bits to the host system 102. The latter read operation is referred to as a "hard" read because the SSD controller 100 reads the bits, decodes them and returns the decoded bits to the host system 102.

The disparity and derivative vectors may be used in a number of ways to generate the estimate. One way to do this is to obtain the read reference voltage corresponding to a disparity value of 0.5 and to obtain the read reference voltage corresponding to the smallest derivative value, or the minima, of the derivative vector within a window defined by the disparity metric, and then to take a weighted average of the read reference voltages to obtain the estimate of the optimal read reference voltage. This process will now be described with reference to FIG. 4.

Figure 4:
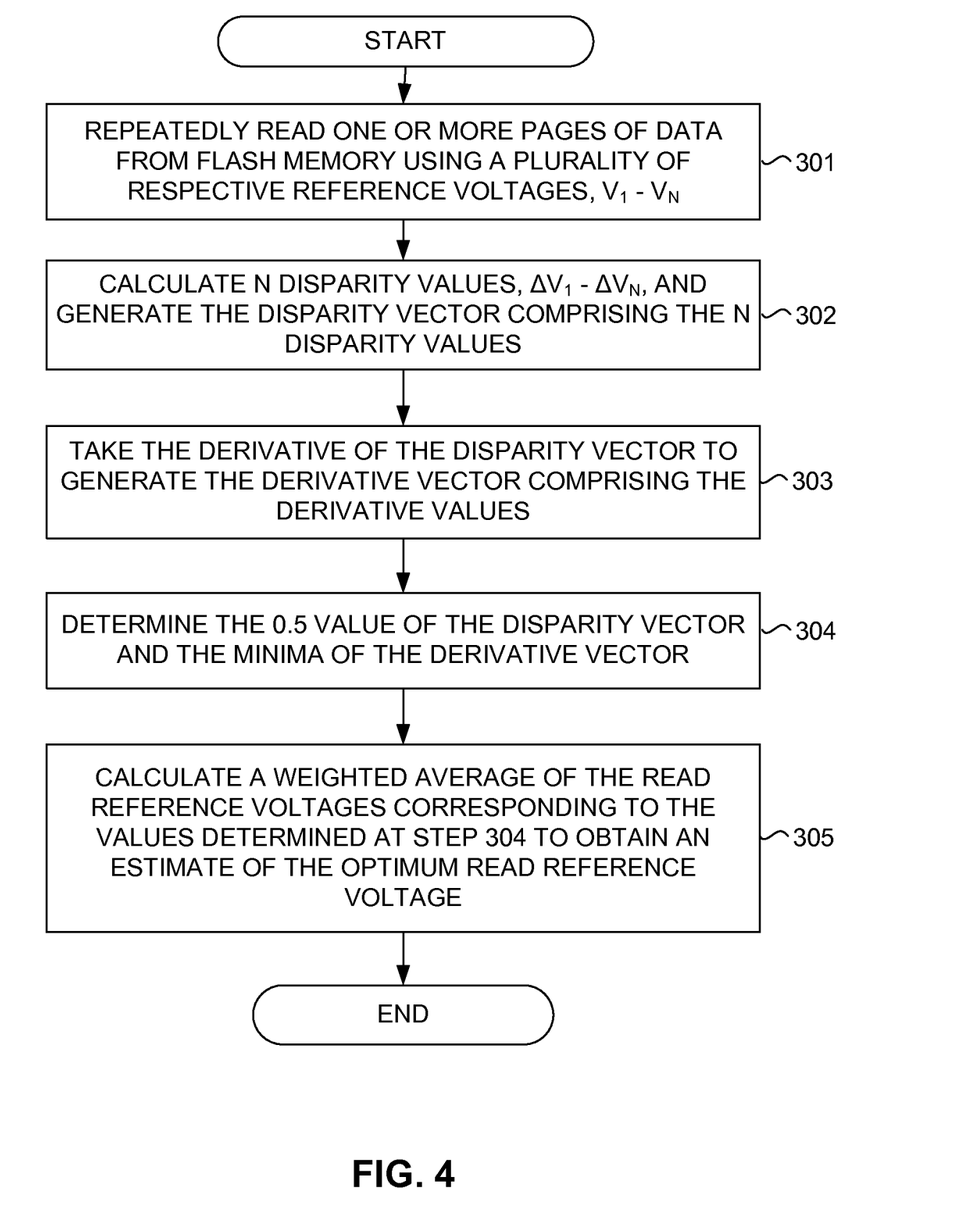
FIG. 4 illustrates a flow diagram that represents the method performed by the SSD controller shown in FIG. 2 in accordance with an illustrative embodiment for obtaining the derivative and disparity metrics and for using those metrics to estimate the optimal read reference voltage.
Figure 5:
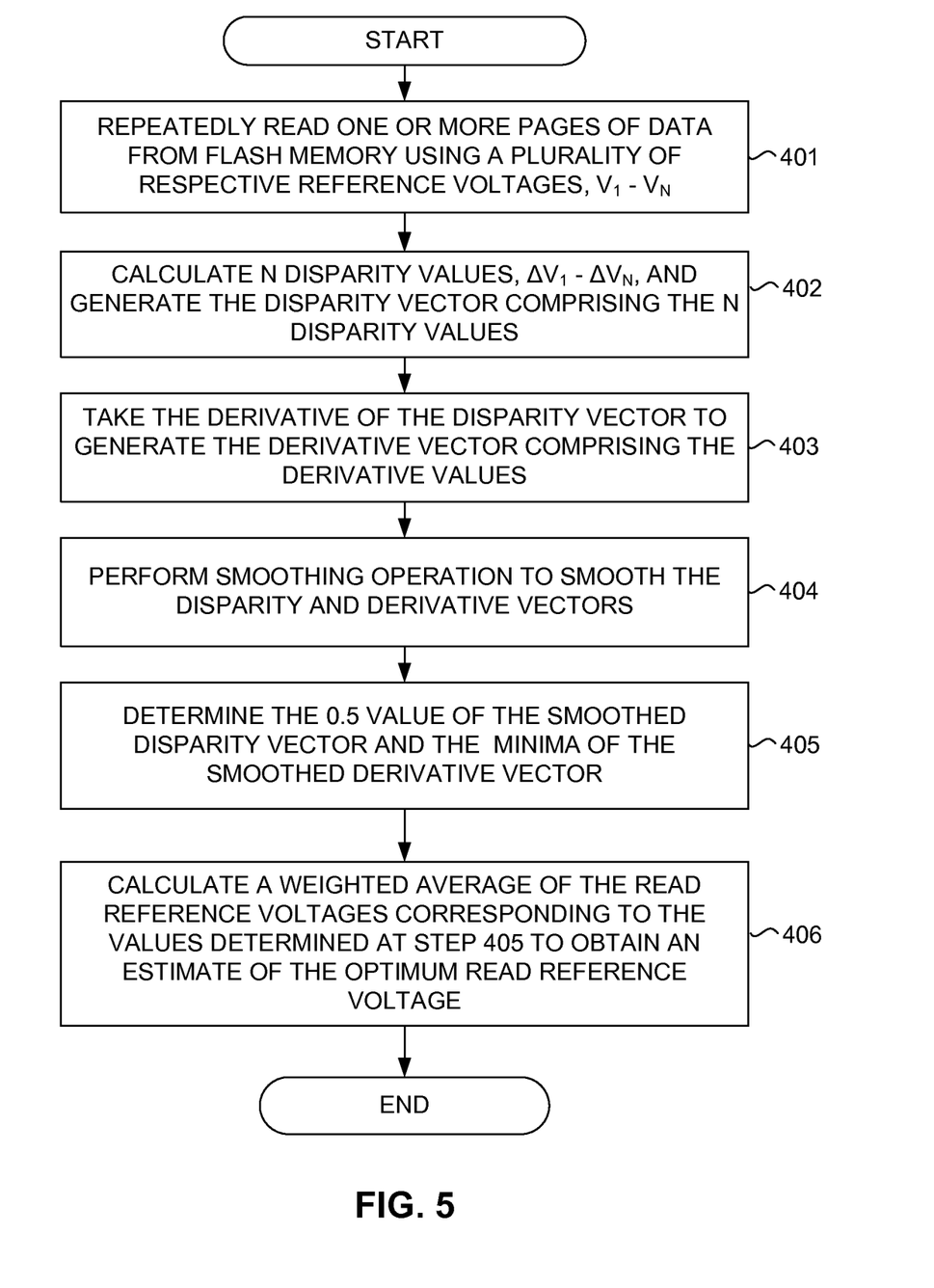
FIG. 5 illustrates a flow diagram that represents a method that is a modification of the method represented by the flow diagram shown in FIG. 4.

FIG. 4 illustrates a flow diagram that represents the method performed by the SSD controller 100 in accordance with an illustrative embodiment for obtaining the derivative and disparity vectors and for using them to obtain an estimate the optimal read reference voltage. In the step represented by block 301 of FIG. 4, one or more pages of data are repeatedly read from one or more of the flash dies 194 using respective different read reference voltages ranging from $V_1$ to $V_N$, where N is a positive integer that is equal to or greater than 2 and typically at least greater than 3. In the step represented by block 302, N disparity values, $\Delta V_1$ to $\Delta V_N$, are calculated for the N read operations, respectively, and a disparity vector comprising the N values is generated in the manner described above with reference to FIG. 3. After the disparity vector has been obtained, the mathematical derivative of the disparity vector is taken to obtain a derivative vector, as described above with reference to FIG. 3. This step is represented by block 303 in FIG. 4.

After the disparity and derivative vectors have been obtained, the 0.5 value of the disparity vector and the minima of the derivative vector are determined, as indicated by block 304. This step is performed by analyzing the values of the disparity vector to determine the value that is equal to 0.5 and by analyzing the values of the derivative vector to determine the minimum value. After these values have been determined, a weighted average of the respective read reference voltages associated with these values is calculated to obtain an estimate of the optimum read reference voltage, as indicated by block 305. The read reference voltages that are to be averaged, $V_{REF,DIS}$ and $V_{REF,DER}$, are weighted based on an understanding or observations of the underlying cell voltage distributions to obtain a more robust estimate of the optimal read reference voltage, $V_{REF,DD}$. For example, the estimate of the optimal read reference voltage may be obtained using weighted values for $V_{REF,DIS}$ and $V_{REF,DER}$ as follows:

$$V_{REF,DD} := (W_{DER} * V_{REF,DER}) + (W_{DISP} * V_{REF,DISP}) / (W_{DER} + W_{DISP})$$

The disparity vector $\overline{\Delta}(\overline{V}) = [\Delta(V_1) \Delta(V_2), \Delta(V_3), \ldots, \Delta(V_N)]$ is a cumulative mass function (CMF) whose derivative is the scaled sum of the two Gaussian distributions with parameters $(\mu_1, \sigma_1)$ and $(\mu_2, \sigma_2)$. The values $W_{DER}$ and $W_{DISP}$ in the equation above are the weights that are used in the weighted-average calculation, and they are also points on the post-processed CMF $\overline{\Delta}$. From processing real flash signals, it was observed that $W_{DER} = 1$ results in nearly optimal performance (in the sense of BER) in the beginning of life of the flash 194. It was also observed that at end-of-life and for certain MLC states of the flash dies 194, $W_{DER} = 1$ is not a good choice. Persons of skill in the art will understand, in view of the description being provided herein, how to choose suitable values for the weights.

The read operations represented by block 301 during which the page or pages are repeatedly read using the different read reference voltages are soft reads. After step 305 has been performed to estimate the optimal read reference voltage, the estimated optimal read reference voltage is used by the SSD controller 100 to perform a hard read of the same page or pages from the from flash memory 199. The SSD controller 100 then decodes the bits that are read and sends the decoded bits to the host system 102.

Many modifications may be made to the method represented by the flow diagram of FIG. 4 to further improve performance. FIG. 5 illustrates a flow diagram corresponding to a method that is a modification of the method represented by the flow diagram shown in FIG. 4. The steps represented by blocks 401-403 of the flow diagram shown in FIG. 5 are identical to the steps represented by blocks 301-303, respectively, of the flow diagram shown in FIG. 4. In step 404, the disparity vector and the derivative vector are smoothed to remove noise. The disparity vector computed from real flash data can be noisy and may not be strictly non-decreasing. One solution for dealing with noise in the disparity vector is to use a local averaging filter to generate a smoothed disparity vector, $\overline{\Delta}(\overline{V})$, as follows: $\overline{\Delta}(\overline{V}) = \overline{\Delta}(\overline{V}) * \overline{E}$, where $\overline{E}$ is a filter coefficient, e.g., $$\overline{E} = \frac{[1, 1, 1]}{3},$$

assuming a local window size of 3. Once the disparity vector has been smoothed in this manner, the 0.5 disparity value in the disparity vector is determined in the step represented by block 405.

Another solution for smoothing the disparity vector to remove noise is as follows. The disparity vector is pre-processed to prune data points that are irregular. For example, the difference between a given disparity value and a neighboring disparity value is taken and compared to a threshold value, A, to determine whether the value is sufficiently irregular that it should be ignored. Mathematically, the disparity vector smoothing step represented by block 404 can be expressed as follows: ignore $\overline{\Delta}_t$, if $$\frac{\overline{\Delta}_t}{\overline{\Delta}_{t-1}} > A$$

or $$\frac{\overline{\Delta}_t}{\overline{\Delta}_{t-1}} < 1.$$

A suitable value for A may be, for example, 2. The 0.5 value of the resulting smoothed disparity vector (i.e., after pruning the irregular values), is then determined in the step represented by block 405.

With reference again to block 404, a local, or windowed, averaging filter of length W is applied on the derivative vector $\overline{\delta}(\overline{V})$ to smooth it. The smoothed derivative vector that is output from the filter is denoted as $\overline{\overline{\delta}}(\overline{V})$. For example, assuming a window size W=3 and a filter coefficient $$\overline{E} = \frac{[1, 1, 1]}{3},$$

the output of the filter is defined as $\overline{\overline{\delta}} = \overline{\delta}(\overline{V}) * \overline{E}$ such that $$\overline{\overline{\delta}}_i = \frac{\overline{\delta}_{i-2} + \overline{\delta}_i + \overline{\delta}_{i+s}}{3},$$

where subscript i denotes the $i_{th}$ element in the corresponding vector. At the step represented by block 405, the minima of the smoothed derivative vector, within a disparity-defined window, is determined. The disparity-defined window is a predefined range of disparity values centered on 0.5. For example, the disparity-defined window could be the range of disparity values that are greater than or equal to $0.5 - \Delta_T$ and less than or equal to $0.5 + \Delta_T$, where $\Delta_T$ is a disparity threshold value that the designer selects. A suitable value for $\Delta_T$ is $\Delta_T = 0.03$. Only using a minima that meets the additional constraint of being within the disparity-defined window ensures that a minima that is attributable to read noise or other disturbances will not be used. This, in turn, ensures that the read reference voltage that is used in the subsequent step represented by block 406 to estimate the optimum read reference voltage is one that is associated with a proper minima and not one that is associated with an erroneous minima caused by noise or other disturbances.

In the step represented by block 406, a weighted average of the read reference voltage corresponding to the 0.5 value of the smoothed disparity vector, $V_{REF,DIS}$, and of the read reference voltage corresponding to the minima of the smoothed derivative vector, $V_{REF,DER}$, is calculated to obtain the estimate of the optimal read reference voltage. Similar to block 305 in FIG. 4, in block 406 of FIG. 5 the read reference voltages that are averaged, $V_{REF,DIS}$ and $V_{REF,DER}$, are weighted based on an understanding or observations of the underlying cell voltage distributions to obtain a more robust estimate of the optimal read reference voltage, $V_{REF,DD}$. For example, the estimate of the optimal read reference voltage may be obtained as follows:

$$V_{REF,DD} := (W_{DER} * V_{REF,DER}) + (W_{DISP} * V_{REF,DISP}) / (W_{DER} + W_{DISP})$$

$$W_{DER} := \overline{\overline{\Delta}}(V_{REF,DER})$$

$$W_{DISP} := 1 - \overline{\overline{\Delta}}(V_{REF,DISP})$$

It should be noted that the mathematical description of the algorithm given above are for the SLC flash case. Persons of skill in the art will understand that the algorithm can be easily extended for MLC flash where four cell distributions rather than two cell distributions are involved. It should also be understood that the flow diagrams of FIGS. 3-5 are intended only to be exemplary or illustrative of the logic underlying the above-described methods. In view of the descriptions herein, persons skilled in the art readily will be capable of programming or configuring a flash memory controller or similar system in any of various ways to effect the above-described methods and similar methods. The blocks described above with regard to FIGS. 3-5 are intended only as examples, and in other embodiments the steps or acts described above and similar steps or acts can occur in any other suitable order or sequence. Steps or acts described above can be combined with others or omitted in some embodiments.

Similarly, the logic elements described above with regard to FIGS. 1 and 2 are intended only as examples, and the logic underlying the above-described method can be modularized in any other suitable manner. In view of the descriptions herein, persons skilled in the art will readily be capable of programming or configuring SSD controller 100 with suitable software or in suitable logic, such as in the form of an application-specific integrated circuit (ASIC) or similar device or combination of devices, to effect the above-described method and similar methods. Also, it should be understood that the combination of software instructions or similar logic and the memory in which such software instructions or similar logic is stored or embodied in non-transitory form for execution in the CPU 171 (FIG. 2) or some other processor of the SSD controller 100 comprises a "computer-readable medium" or "computer program product" as that term is used in the patent lexicon. For example, the steps represented by the flow diagrams of FIGS. 3 5 will typically be stored as computer instructions in a computer-readable medium, such as in local memory of the SSD controller 100, that is accessible by the CPU 171.

It should be noted that the invention has been described with reference to one or more exemplary embodiments for the purpose of demonstrating the principles and concepts of the invention. The invention is not limited to these embodiments. As will be understood by persons skilled in the art, in view of the description provided herein, many variations may be made to the embodiments described herein and all such variations are within the scope of the invention.

What is claimed is:

1. A storage system comprising:
   a nonvolatile memory (NVM) comprising at least a first flash memory die having a plurality of flash memory cells; and
   a solid-state disk (SSD) controller in communication with the NVM memory via a first interface (I/F) that interfaces the NVM with the SSD controller, the SSD controller being configured to execute read commands in order to read the memory cells, and wherein the SSD controller is configured to perform a soft read process during which the SSD controller repeatedly reads one or more pages of the memory cells N times using N respective read reference voltages, $V_1$ to $V_N$, where N is a positive integer that is equal to or greater than 2, and wherein during the soft read process, the SSD controller calculates N disparity values, $\Delta V_1$ to $\Delta V_N$, for the N reads, respectively, and generates a disparity vector comprising the N disparity values, wherein each disparity value is calculated by taking a ratio of a number of 1 bits in a bit sequence corresponding to the respective pages or pages read to a total number of bits in the bit sequence, and wherein during the soft read process, after generating the disparity vector, the SSD controller takes a derivative of the disparity vector to obtain a derivative vector having N−1 derivative values, $\delta(V_1)$ to $\delta(V_{N-1})$, and then uses the disparity vector and the derivative vector to estimate an optimal read reference voltage, $V_{REF,DD}$, to be used by the SSD controller in a subsequent hard read process to read said one or more pages.

2. The storage system of claim 1, wherein the N−1 derivative values are obtained by taking differences between adjacent disparity values in the disparity vector.

3. The storage system of claim 2, wherein the SSD controller uses the disparity and derivative vectors by determining which of the disparity values is equal to or nearest to 0.5 and which of the derivative values is a minimum derivative value, and wherein the SSD controller determines which of the read reference voltages $V_{REF,DIS}$ used during the soft read process is associated with the disparity value equal to or nearest to 0.5 and determines which of the read reference voltages $V_{REF,DER}$ used during the soft read process is associated with the minimum derivative value, and wherein the SSD controller then uses the read reference voltages $V_{REF,DIS}$ and $V_{REF,DER}$ that are associated with the disparity value equal to or nearest to 0.5 and with the minimum derivative value, respectively, to estimate the optimal read reference voltage $V_{REF,DD}$.

4. The storage system of claim 3, wherein the SSD controller uses the read reference voltages $V_{REF,DIS}$ and $V_{REF,DER}$ to estimate the optimal read reference voltage $V_{REF,DD}$ by calculating a weighted average of the read reference voltages $V_{REF,DIS}$ and $V_{REF,DER}$, wherein the weighted average is the optimal read reference voltage $V_{REF,DD}$.

5. The storage system of claim 3, wherein the disparity value that is determined by the SSD controller to be equal to or nearest to 0.5 is a disparity value from the smoothed disparity vector, and wherein the derivative value that is determined by the SSD controller to be the minimum derivative value is a derivative value from the smoothed derivative vector.

6. The storage system of claim 5, wherein the smoothing process is a local averaging process that averages neighboring disparity values of the disparity vector to obtain the smoothed disparity vector and that averages neighboring derivative values of the derivative vector to obtain the smoothed derivative vector.

7. The storage system of claim 5, wherein the smoothing process is a pruning process that determines whether each subject disparity value is sufficiently different from one or more neighboring disparity values, and if so, does not use the subject disparity value in the smoothed disparity vector, and wherein the pruning process determines whether each subject derivative value is sufficiently different from and one or more neighboring derivative values, and if so, does not use the subject derivative value in the smoothed derivative vector.

8. The storage system of claim 3, wherein when the SSD controller determines which of the derivative values is the minimum derivative value, the SSD controller analyzes the derivative values that are derived from disparity values that are within a predefined window of disparity values.

9. The storage system of claim 8, wherein the predefined window of disparity values is a range of the disparity values that are greater than or equal to $0.5-\Delta_T$ and less than or equal to $0.5+\Delta_T$, where $\Delta_T$ is a predefined disparity threshold value.

10. The storage system of claim 9, wherein $\Delta_T$ ranges from 0 to 0.4.

11. The storage system of claim 9, wherein the weighted average is calculated as:

$$(W_{DER}*V_{REF,DER})+(W_{DISP}*V_{REF,DISP})/(W_{DER}+W_{DISP}),$$

where $W_{DER}$ and $W_{DISP}$ are preselected weight values.

12. A solid-state disk (SSD) controller in communication with a nonvolatile memory (NVM) via a first interface (I/F), the NVM comprising at least a first flash memory die having a plurality of flash memory cells, the SSD controller comprising:
   a memory buffer; and
   a processor configured to execute read commands in order to read the memory cells, wherein the processor is configured perform a soft read process during which the processor repeatedly reads one or more pages of the memory cells N times using N respective read reference voltages, $V_1$ to $V_N$, and stores the read page or pages in the memory buffer, where N is a positive integer that is equal to or greater than 2, and wherein during the soft read process, the processor processes the read page or pages stored in the memory buffer to calculate N disparity values, $\Delta V_1$ to $\Delta V_N$, for the N reads, respectively, and generates a disparity vector comprising the N disparity values, wherein each disparity value is calculated by taking a ratio of a number of 1 bits in a bit sequence corresponding to the respective pages or pages read to a total number of bits in the bit sequence, and wherein during the soft read process, after generating the disparity vector, the processor takes the derivative of the disparity vector to obtain a derivative vector having N−1 derivative values, $\delta(V_1)$ to $\delta(V_{N-1})$, and then uses the disparity vector and the derivative vector to estimate an optimal read reference voltage, $V_{REF,DD}$, to be used by the SSD controller in a subsequent hard read process to read said one or more pages.

13. The SSD controller of claim 12, wherein the N−1 derivative values are obtained by taking differences between adjacent disparity values in the disparity vector.

14. The storage system of claim 13, wherein the processor uses the disparity and derivative vectors by determining which of the disparity values is equal to or nearest to 0.5 and which of the derivative values is a minimum derivative value, and wherein the processor determines the read reference voltage, $V_{REF,DIS}$, that was used during the soft read process to read the page or pages associated with the disparity value equal to or nearest to 0.5 and determines the read reference voltage, $V_{REF,DER}$, that was used during the soft read process to read the page or pages associated with the minimum derivative value, and wherein the processor then uses the read reference voltages $V_{REF,DIS}$ and $V_{REF,DER}$ to estimate an optimal read reference voltage $V_{REF,DD}$.

15. The SSD controller of claim 14, wherein the processor uses the read reference voltages $V_{REF,DIS}$ and $V_{REF,DER}$ to estimate the optimal read reference voltage $V_{REF,DD}$ by calculating a weighted average of the read reference voltages $V_{REF,DIS}$ and $V_{REF,DER}$, wherein the weighted average is the optimal read reference voltage $V_{REF,DD}$.

16. The SSD controller of claim 14, wherein the disparity value that is determined by the SSD controller to be equal to or nearest to 0.5 is a disparity value from the smoothed disparity vector, and wherein the derivative value that is determined by the SSD controller to be the minimum derivative value is a derivative value from the smoothed derivative vector.

17. The SSD controller of claim 16, wherein the smoothing process is a local averaging process that averages neighboring disparity values of the disparity vector to obtain the smoothed disparity vector and that averages neighboring derivative values of the derivative vector to obtain the smoothed derivative vector.

18. The SSD controller of claim 16, wherein the smoothing process is a pruning process that determines whether each subject disparity value is sufficiently different from one or more neighboring disparity values, and if so, does not use the subject disparity value in obtaining the smoothed disparity vector, and wherein the pruning process determines whether each subject derivative value is sufficiently different from and one or more neighboring derivative values, and if so, does not use the subject derivative value in obtaining the smoothed derivative vector.

19. The SSD controller of claim 14, wherein when the processor determines which of the derivative values is the minimum derivative value, the processor analyzes the derivative values that are derived from disparity values that are within a predefined window of disparity values.

20. The SSD controller of claim 19, wherein the predefined window of disparity values is a range of the disparity values that are greater than or equal to $0.5-\Delta_T$ and less than or equal to $0.5+\Delta_T$, where $\Delta_T$ is a predefined disparity threshold value.

21. The SSD controller of claim 20, wherein, ranges from 0 to 0.4.

22. The storage system of claim 20, wherein the weighted average is calculated as:

$$(W_{DER}*V_{REF,DER})+(W_{DISP}*V_{REF,DISP})/(W_{DER}+W_{DISP}),$$

where $W_{DER}$ and $W_{DISP}$ are preselected weight values.

23. A method for use in a storage system for estimating an optimum read reference voltage to be used by a solid-state disk (SSD) controller of the system for reading data from a nonvolatile memory (NVM) comprising at least a first flash memory die having a plurality of flash memory cells, the SSD controller being in communication with the NVM memory via a first interface (I/F) of the storage system, the method comprising:
 with the SSD controller, performing a soft read process during which the SSD controller repeatedly reads one or more pages of the memory cells N times using N respective read reference voltages, $V_1$ to $V_N$, where N is a positive integer that is equal to or greater than 2;
 in the SSD controller, during the soft read process, calculating N disparity values, $\Delta V_1$ to $\Delta V_N$, for the N reads, respectively, and generating a disparity vector comprising the N disparity values, wherein each disparity value is calculated by taking a ratio of a number of 1 bits in a bit sequence corresponding to the respective pages or pages read to a total number of bits in the bit sequence;
 in the SSD controller, during the soft read process, after generating the disparity vector, taking a derivative of the disparity vector to obtain a derivative vector having N−1 derivative values, $\delta(V_1)$ to $\delta(V_{N-1})$; and
 in the SSD controller, using the disparity vector and the derivative vector to estimate an optimal read reference voltage, $V_{REF,DD}$, to be used by the SSD controller in a subsequent hard read process to read said one or more pages.

24. The method of claim 23, wherein the N−1 derivative values are obtained by taking differences between adjacent disparity values in the disparity vector.

25. The method of claim 24, wherein the step of using the disparity vector and the derivative vector to estimate the optimal read reference voltage $V_{REF,DD}$ comprises:
 in the SSD controller, determining which of the disparity values is equal to or nearest to 0.5 and which of the derivative values is a minimum derivative value; and
 in the SSD controller, determining which of the read reference voltages $V_{REF,DIS}$ used during the soft read process is associated with the disparity value that is equal to or nearest to 0.5;
 in the SSD controller, determining which of the read reference voltages $V_{REF,DER}$ used during the soft read process is associated with the minimum derivative value; and
 in the SSD controller, using the reference voltages $V_{REF,DIS}$ and $V_{REF,DER}$ that are associated with the disparity value equal to or nearest to 0.5 and with the minimum derivative value, respectively, to estimate the optimal read reference voltage $V_{REF,DD}$.

26. The method of claim 25, wherein the step of using the read reference voltages $V_{REF,DIS}$ and $V_{REF,DER}$ to estimate the optimal read reference voltage $V_{REF,DD}$ comprises:
 in the SSD controller, calculating a weighted average of the read reference voltages $V_{REF,DIS}$ and $V_{REF,DER}$, wherein the weighted average is the optimal read reference voltage $V_{REF,DD}$.

27. The method of claim 25, further comprising:
 prior to using the disparity vector and the derivative vector to estimate the optimal read reference voltage $V_{REF,DD}$:
 smoothing the disparity vector to obtain a smoothed disparity vector, and wherein the disparity value that is determined by the SSD controller to be equal to or nearest to 0.5 is a disparity value obtained from a smoothed disparity vector; and
 smoothing the derivative vector to obtain a smoothed derivative vector, wherein the derivative value that is determined by the SSD controller to be the minimum derivative value is a derivative value obtained from the smoothed derivative vector.

28. The method of claim 27, wherein the smoothing process is a local averaging process that averages neighboring disparity values of the disparity vector to obtain the smoothed disparity vector and that averages neighboring derivative values of the derivative vector to obtain the smoothed derivative vector.

29. The method of claim 27, wherein the smoothing process is a pruning process that determines whether each subject disparity value is sufficiently different from and one or more neighboring disparity values, and if so, does not use the subject disparity value in the smoothed disparity vector, and wherein the pruning process determines whether each subject derivative value is sufficiently different from and one or more neighboring derivative values, and if so, does not use the subject derivative value in the smoothed derivative vector.

30. The method of claim 28, wherein when the SSD controller determines which of the derivative values is the minimum derivative value, the SSD controller analyzes the derivative values that are based on disparity values that are within a predefined window of disparity values.

31. The method of claim 30, wherein when the predefined window of disparity values is a range of the disparity values that are greater than or equal to $0.5-\Delta_T$ and less than or equal to $0.5+\Delta_T$, where $\Delta_T$ is a predefined disparity threshold value.

32. The method of claim 31, wherein $\Delta_T$ ranges from 0 to 0.4.

33. The method of claim 31, wherein the weighted average is calculated as:

$$(W_{DER}*V_{REF,DER})+(W_{DISP}*V_{REF,DISP})/(W_{DER}+W_{DISP}),$$

where $W_{DER}$ and $W_{DISP}$ are preselected weight values.

34. A non-transitory computer-readable medium (CRM) having computer instructions stored thereon for execution by a processor of a solid-state disk (SSD) controller for estimating an optimum read reference voltage to be used by the SSD controller for reading data from a nonvolatile memory (NVM) comprising at least a first flash memory die having a plurality of flash memory cells, the SSD controller being in communication with the NVM memory via a first interface (I/F) of the storage system, the CRM comprising:

a first set of instructions for performing a soft read process during which the SSD controller repeatedly reads one or more pages of the memory cells N times using N respective read reference voltages, $V_1$ to $V_N$, where N is a positive integer that is equal to or greater than 2;

a second set of instructions for calculating N disparity values, $\Delta V_1$ to $\Delta V_N$, for the N reads, respectively, and for generating a disparity vector comprising the N disparity values, wherein each disparity value is calculated by taking a ratio of a number of 1 bits in a bit sequence corresponding to the respective pages or pages read to a total number of bits in the bit sequence;

a third set of instructions for taking a derivative of the disparity vector to obtain a derivative vector having N−1 derivative values, $\delta(V_1)$ to $\delta(V_{N-1})$; and a fourth set of instructions for using the disparity vector and the derivative vector to estimate an optimal read reference voltage, $V_{REF,DD}$, to be used by the SSD controller in a subsequent hard read process to read said one or more pages.

* * * * *